United States Patent [19]

Jackson et al.

[11] Patent Number: 4,849,802

[45] Date of Patent: Jul. 18, 1989

[54] THERMALLY STABLE LOW RESISTANCE CONTACT

[75] Inventors: Thomas N. Jackson, Peekskill; Masanori Murakami, Goldens Bridge; William H. Price, East Rockaway; Sandip Tiwari, Ossining; Jerry M. Woodall, Bedford Hills; Steven L. Wright, Yorktown Heights, all of N.Y.

[73] Assignee: IBM Corporation, Armonk, N.Y.

[21] Appl. No.: 233,851

[22] Filed: Aug. 16, 1988

Related U.S. Application Data

[63] Continuation of Ser. No. 146,857, Jan. 22, 1988, abandoned, which is a continuation of Ser. No. 820,849, Jan. 21, 1986, abandoned.

[51] Int. Cl.$^4$ .................... H01L 23/54; H01L 23/14
[52] U.S. Cl. ......................................... 357/71; 357/67
[58] Field of Search .................... 357/15, 67, 71, 16

[56] References Cited

U.S. PATENT DOCUMENTS 4,188,710  2/1980  Davey et al. ............... 357/67
4,316,201  2/1982  Christou et al. ............ 357/71

FOREIGN PATENT DOCUMENTS 0123936  7/1984  European Pat. Off. .

OTHER PUBLICATIONS

"The Role of Compound Formation and Heteroepitaxy in Indium-Based Ohmic Contacts to GaAs"-Lakhani-J. Appl. Phys., 56 (6), Sep. 15, 1984, pp. 1888-1891.

"Simultaneous Diffusion of Zinc and Indium into GaAs: A New Approach for the Formation of Ion Resistance Ohmic Contacts to Semiconductors"-Shealey et al-pp. 410-412, Appl. Phy. Letts., 47(4), Aug. 15, 1985.

"Contact Resistances of Several Metals and Alloys to GaAs"-Matino et al-Journal of the ElectoChem. Society-vol. 116, No. 5, May 1969, pp. 709-711.

T. Sebestyen et al-"Thin-Phase Epitaxy for Good Semiconductor Metal Ohmic Contacts", IEEE Trans. on Electron Devices, vol. ED-22, No. 12, Dec. 1975, pp. 1073-1076.

A. Christou, "Solid Phase Formation in Au:Ge/Ni, Ag/In/Ge, In/Au:Ge GaAs Ohmic Contact Systems", Solid State Electronics, vol. 22 (1979), pp. 141-149.

S. Tiwari, T. S. Kuan and E. Tierney, "Ohmic Contacts to n-GaAs with Germanide Over Layers", Int. Elect. Dev. Meeting, p. 115 (1983).

T. Sawada et al, "Non-Alloyed Ohmic Contacts to n-GaAs Using Epitaxial Ge Layers", Proceedings of Material Research Conference (1985).

D. Martin, "In/Pt Ohmic, Contacts to GaAs", Journnal of Applied Physics, 58(7), Oct. 1, 1985, pp. 2659-2661.

A. Callegari et al, "Uniform and Thermally Stable AuNiGe Ohmic Contacts to GaAs", Appl. Phys. Lett., 46(12), Jun. 15, 1985, p. 1141.

H. Krautle et al, IEEE Transactions on Electron Devices, "Contacts on GaInAs", vol. ED-32, No. 6, Jun. 1985, pp. 1119-1123.

N. Zhu et al, "Stable Ohmic Contact to GaAs with TiN Diffusion Barrier", Thin Solid Films, vol. 119, No. 1, Sep. 1984, pp. 5-9.

Primary Examiner—Andrew J. James
Assistant Examiner—Sheila V. Clark
Attorney, Agent, or Firm—Perman & Green

[57] ABSTRACT

In a semiconductor device, a contact with low resistance to a III-V compound semiconductor substrate was fabricated using refractory materials and small amounts of indium as the contact material. The contact material was formed by depositing Mo, Ge and W with small amounts of In onto doped GaAs wafers. The contact resistance less than 1.0 ohm millimeter was obtained after annealing at 800° C. and the resistance did not increase after subsequent prolonged annealing at 400° C.

21 Claims, 1 Drawing Sheet

THERMALLY STABLE LOW RESISTANCE CONTACT

This is a continuation of co-pending application Ser. No. 07/146,857 filed on Jan. 22, 1988 which is a continuation of application Ser. No. 06/820,849, filed on Jan. 21, 1986, both abandoned.

BACKGROUND OF THE INVENTION

This invention relates to the fabrication of semiconductor devices having low resistance contacts and, more particularly, to the construction of a thermally stable non-alloyed contact containing small amounts of indium to yield a low resistance path to electric current.

Semiconductor devices frequently employ low resistance contacts to provide an electrically conducting path between semiconductor material and an electric circuit external to the semiconductor material. A field-effect transistor (F E T ) is a common example of a semiconductor device having low resistance contacts. The low-resistance transistor contacts are of the form known as ohmic contacts and are used in the formation of the source and the drain terminals of the transistor. The low resistance contact forms a path to the semiconductor and allows electrical current to flow into or out of the semiconductor without significant voltage drop.

A semiconductor material of particular interest herein is gallium arsenide (GaAs). Low resistance contacts to GaAs and related III–V compound semiconductors are essential for the fabrication of many high performance optical, microwave and logic devices. A commonly used low resistance contact to n-GaAs is composed of an alloyed gold-nickel-germanium (Au-Ni-Ge) system which produces contact resistance in the range of 0.2 to 1.0 ohm-millimeters. Other materials frequently used in the construction of contacts to GaAs are tungsten silicide and layers of gold, titanium and platinum.

In the manufacture and packaging of a semiconductor device, such as the foregoing FET, after formation of low resistance contacts and non-ohmic gates, the devices are required to withstand an elevated temperature, typically 400° C., for periods of a few minutes to several hours. Such heating over a sustained interval of time increases the resistance. For example, the resistance of a contact of Au-Ni-Ge has been observed to increase by a factor of three during annealing of the contact for 5 hours at 400° Centigrade.

In the construction of a low resistance contact, the resistance is optimized by appropriate selection of material composition and by the cleaning of the substrate prior to the deposition of the material used in the low resistance contact. While presently available techniques may be employed to provide low resistance contacts with acceptably low values of resistance, the above noted problem of increase in resistance with prolonged heating limits the application of currently used low resistance contacts.

SUMMARY OF THE INVENTION

The foregoing problem is overcome and other advantages are provided by the construction of a new type of low resistance contact to a III–V compound semiconductor layer in the building of a semiconductor device. In accordance with the invention, the low resistance contact comprises a conductive refractory material with a small amount of indium added. The small amount of indium is detectable by secondary ion mass spectroscopy, and has been found to be located at least in the region of the interface between the conductive refractory material and the III–V compound semiconductor layer. The conductive refractory material may be composed of one or more layers or regions of refractory metals and may also contain one or more dopant elements useful for providing n-type or p-type conductivity to the III–V compound semiconductor layer.

In contrast to previous low resistance contacts, the low resistance contact of the invention does not contain materials such as gold or tin that alloy with a III–V compound semiconductor at low temperatures. After formation, the contact is made low resistance by annealing at high temperature in the range of 600°–1200° C. for an interval of time ranging from a few seconds to a few hours. The resulting low resistance contact is non-alloyed, uniform and thermally stable. The contact can maintain a low value of contact resistance at elevated temperatures during prolonged periods of time (such as 400° C. for many hours).

BRIEF DESCRIPTION OF THE DRAWINGS

The foregoing aspects and other features of the invention are explained in the following description, taken in connection with the accompanying drawings wherein.

DETAILED DESCRIPTION

Figure 1:
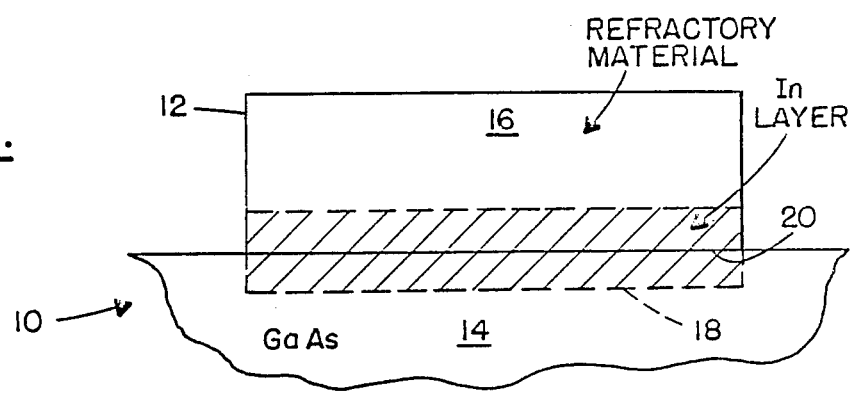
FIG. 1 is an enlarged side view of a low resistance contact formed in accordance with the invention.

FIG. 1 shows a portion of a semiconductor device 10 which may be a transistor, diode or other type of component. The device 10 has a contact 12 disposed on a semiconductor material 14 to provide electrical connection to the device 10. The contact 12 may provide any desired value of resistance as may be required for building the device 10. However, in view of the fact that, usually, it is desired to minimize the resistance in a connection of the device 10 to the external circuit, the preferred embodiment of the invention is directed to the construction of a low resistance contact, less than approximately one ohm millimeter.

In accordance with a major feature of the invention, the contact 12 is provided with the property of being thermally stable so as to retain the value of resistance at both normal environmental temperatures as well as at elevated temperatures, approximately 400° C. This is accomplished by constructing the contact 12 of layer 16 of refractory material that is electrically conductive, and by dispersing indium at low concentration in a region 18 at the interface 20 between the layer 16 and the semiconductor 14.

Materials considered as refractory do not melt or sublime at elevated temperatures, at least up to approximately 800° C. Refractory materials which are used in a preferred embodiment of the invention include tungsten (W) and molybdenum (Mo). Other electrically conductive refractory materials for construction of the invention include, but are not limited to, titanium, zirconium, hafnium, vanadium, niobium, tantalum, rhenium, osmium, iridium, platinum, rubidium, and cobalt. Also, electrically conductive refractory compounds such as tungsten carbide, tungsten silicide and boron carbide may be employed.

While the principles of the invention apply to the use of various types of semiconductor materials in the semiconductor 14, a primary interest is in semiconductor materials formed of elements from groups III and V of the periodic table of the elements. By way of example, gallium arsenide (GaAs) is employed in the preferred embodiment of the invention for the construction of the device 10. However, it is to be understood that other III–V semiconductor materials such as gallium-aluminum-arsenide and gallium-indium-arsenide may be employed. In the event that a dopant (not necessarily a refractory material) may be desired in the semiconductor 14, the preferred embodiment of the invention has employed germanium (Ge) by way of example, though other well-known dopants may also be employed.

FIG. 1 demonstrates a simplified form of the invention which is constructed by placing the semiconductor 14 in a vacuum chamber. Thereupon a thin layer of indium is deposited to a thickness of 25-50 angstroms by conventional means, such as by the use of a source of indium wherein the indium is evaporated by an incident beam of electrons. Then the layer 16 of tungsten is deposited upon the indium by conventional techniques. The layer 16 has a thickness of 500-1000 angstroms, though a greater thickness may be employed if desired. The foregoing structure is capped with a high temperature capping material such as silicon nitride, and annealed at a temperature of 800° C. for approximately 10 minutes. During the anneal, the indium diffuses into both the tungsten of the layer 16 and into to gallium arsenide of the layer 14 as shown in the figure by the region 18. The silicon nitride capping layer may then be removed, leaving the contact 12 as shown in FIG. 1. Further details of construction will now be presented with respect to the embodiment of the invention as shown in FIG. 2.

Figure 2:
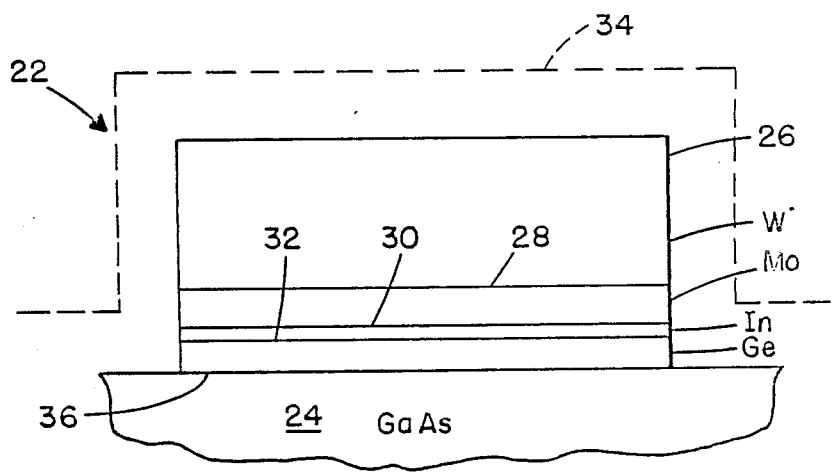
FIG. 2 is an enlarged sectional view of the contact of FIG. 1 prior to diffusion in accordance with a method of manufacture.

FIG. 2 shows a partially completed contact 22 which is an alternative embodiment of the simplified contact 12 of FIG. 1, the contact 22 being a preferred embodiment of the invention. In order to facilitate description, the principles of the invention will be set forth using as an example the semiconductor material GaAs with n-type conductivity. It is understood that the parameters disclosed below may be readily converted to parameter values appropriate for other type compound semiconductor materials in accordance with the theory of the invention.

In accordance with the invention, the structure of FIG. 2 is formed of layers of germanium, indium, molybdenum and tungsten which are deposited upon the n-type GaAs semiconductor material. More specifically, the contact 22 is disposed on a layer 24 of the n-type GaAs material, which layer corresponds to the layer 14 in the construction of the device 10 of FIG. 1. The contact 22 comprises a layer 26 of tungsten, a layer 28 of molybdenum located beneath the layer 26, a thin layer 30 of indium located beneath the layer 28, and a layer 32 of germanium disposed between the indium layer 30 and the GaAs layer 24. The various layers may be deposited by any of the standard high purity material deposition techniques, for example, vacuum evaporation. First, the germanium layer 32 is deposited upon the GaAs layer 24 to a thickness of approximately 100 angstroms. The germanium has been selected because it can serve as an n-type dopant for GaAs; as noted above n-type GaAs is used by way of example in this embodiment. This is followed by the deposition of the indium layer 30 to a thickness in the range of 5-100 angstroms. Then the molybdenum layer 28 is deposited upon the indium layer 30 to a thickness of approximately 100 angstroms, this being followed by the deposition of the tungsten layer 26 to a thickness of approximately 500-1000 angstroms.

The deposition of these layers 32, 30, 28 and 26 may be done at room temperature. After the structure detailed above is formed and, if desired, patterned using standard integrated circuit patterning techniques such as photolithography and reactive ion etching or lift-off, the structure is enclosed with a capping layer 34 of a material such as the silicon nitride used in FIG. 1. The capping layer 34 is shown in phantom because it may be removed upon completion of the manufacturing process. The capping layer 34 prevents the ingress of any impurities during high temperature annealing, and also prevents any out diffusion of atoms within the foregoing layers during high temperature annealing.

The partially completed contact 22 is then annealed at the foregoing temperature of approximately 800° for approximately 10 minutes in a furnace (not shown). If desired, the furnace may have an environment of argon-hydrogen mixture to prevent any oxidation of the silicon-nitride layer and also to serve as a precaution against the possibility of any impurities passing through any defects in the silicon-nitride, layer, thereby maintaining the purity of the substances within the contact 22.

During the 10 minute annealing interval, there is interdiffusion among the atoms of the layers 28, 30, and 32. In particular, indium diffuses into the germanium layer 32, with a small quantity of the indium passing through the interface 36 between the contact 22 and the GaAs layer 24 to provide a region (not shown) of low concentration indium on both sides of the interface 36. The region of low concentration indium in FIG. 2 is similar to the region 18 of FIG. 1. By way of example in the concentration of the indium in the foregoing region, it is believed that a concentration on the order of approximately one percent of the indium, by atomic percentage, is present along the interface 36 between the contact 22 and the GaAs layer 24.

At the completion of the annealing interval the contact 22 is cooled to room temperature, and the silicon-nitride capping layer 34 may be removed, if desired, by reactive ion etching.

As noted above, the germanium serves as a dopant to provide the desired conductivity to the GaAs layer 24. The molybdenum tends to bind up any excess germanium by compounding therewith, and thereby improves control of the electrical characteristics of the contact to the GaAs. The foregoing construction procedure applies also to the use of other dopants which may be employed in accordance with the spirit of the invention. Also, depending on the choice of materials used in the construction, capless annealing may be employed with appropriate selection of the environment, such as a hydrogen-argon mixture, in the furnace to preserve the composition of the contact.

Figure 3:
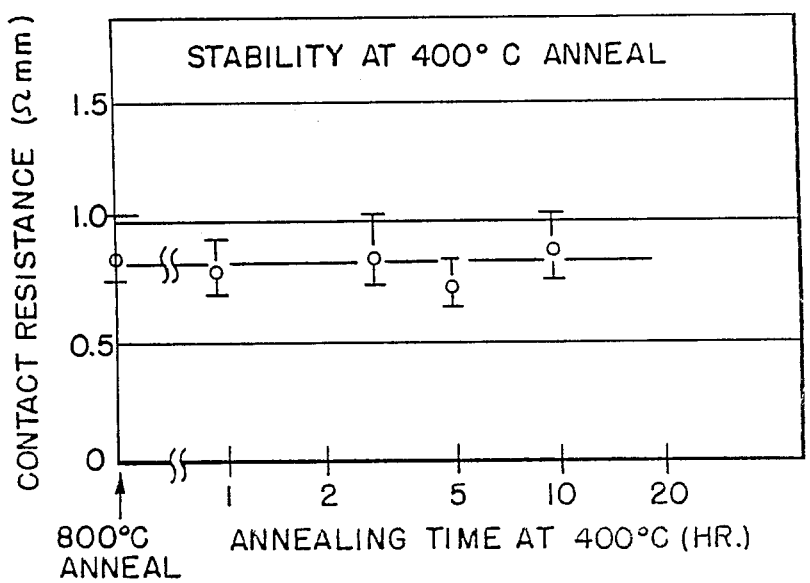
FIG. 3 is a graph showing stability of the contact resistance of the structure of FIG. 2 with annealing time.

The graph in FIG. 3 shows that a contact resistance of less than 1.0 ohm-millimeter is maintained even at an elevated temperature of 400° C. for many hours. The values of contact resistance have been obtained experimentally by use of the well-known transmission line method of measurement. Thus, it is appreciated that the foregoing description provides a contact to III-V semiconductor materials using one or more conductive refractory materials in combination with a small amount of indium. The contact is a thermally stable, uniform contact having low electrical resistance.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

Having thus described our invention, what we claim as new, and desire to secure by Letters Patent is:

1. In a III-V compound semiconductor device, a contact to a layer of said semiconductor comprising:
   at least one conductive refractory material deposited as a layer along a surface of said semiconductor layer; and wherein
   atoms of indium are diffused along an interface between said refractory layer and said semiconductor layer to form a non-alloyed contact, the amount of said indium being equal to a layer of indium having a thickness in the range of 5-100 angstroms.

2. A contact according to claim 1 wherein said semiconductor is gallium-arsenide.

3. A contact according to claim 1 wherein said semiconductor is gallium-aluminum-arsenide.

4. A contact according to claim 1 wherein said semiconductor is gallium-indium-arsenide.

5. A ohmic contact according to claim 1 further comprising a second layer of said refractory material, one of said refractory layers being molybdenum, and the second of said refractory layers being tungsten.

6. An ohmic contact according to claim 5 further comprising a layer of dopant material, said dopant layer being germanium.

7. In a III-V compound semiconductor device, a contact to a layer of said semiconductor comprising:
   at least one conductive refractory material deposited as a layer along a surface of said semiconductor layer;
   at least one dopant material appropriate for the conductivity type of said semiconductor; and wherein
   atoms of indium are diffused along an interface between said refractory layer and said semiconductor layer to form a uniform thermally-stable contact, the amount of said indium being equal to a layer of indium having a thickness in the range of 5-100 angstroms.

8. A contact according to claim 7 wherein said semiconductor is gallium-arsenide.

9. A contact according to claim 7 wherein said semiconductor is gallium-aluminum-arsenide.

10. A contact according to claim 7 wherein said semiconductor is gallium-indium-arsenide.

11. An ohmic contact according to claim 7 further comprising a second layer of said refractory material, one of said refractory layers being molybdenum, and the second of said refractory layers being tungsten.

12. A contact according to claim 7 wherein said semiconductor is n-type and said dopant material is germanium.

13. A contact according to claim 7 wherein refractory material comprises layers of molybdenum and tungsten.

14. In a III-V compound semiconductor device, a contact to a layer of said semiconductor made by the process of:
   depositing a layer of indium on a substrate of said semiconductor to a depth in the range of 5-100 angstroms;
   depositing a layer of refractory material composed of at least one conductive refractory material upon said layer of indium resulting in a layered structure; and
   annealing said layered structure at a temperature sufficiently high to induce diffusion of indium atoms from said indium layer into said substrate.

15. A contact according to claim 14 wherein the process further comprises a step of depositing a layer of dopant on said substrate prior to said step of depositing said indium layer.

16. A contact according to claim 15 wherein said substrate is GaAs, said dopant layer is a layer of germanium having a thickness of approximately 100 angstroms, and said annealing temperature is approximately 800 degrees centigrade.

17. In a III-V compound semiconductor device, a contact to a semiconductor layer of said device comprising:
   a refractory layer of conductive refractory material;
   a dopant layer of dopant material appropriate for the conductivity type of said semiconductor, said dopant layer being disposed between said refractory layer and said semiconductor layer; and
   atoms of indium diffused into said refractory layer at an interface between said refractory layer and said dopant layer, said atoms of indium being further diffused through said dopant layer and along an interface between said dopant layer and said semiconductor layer to form a uniform thermally-stable contact, the amount of said indium being equal to a layer of indium having a layer of thickness in the rang of 5-100 angstroms.

18. A contact according to claim 17 wherein said refractory layer is formed of molybdenum, said dopant layer is formed of germanium, and said semiconductor layer is formed of gallium arsenide, and wherein the thickness of said dopant layer is approximately 100 angstroms..

19. A contact according to claim 18 further comprising a second refractory layer disposed on a side of said first-mentioned refractory layer opposite said dopant layer.

20. A contact according to claim 19 wherein said second refractory layer is formed of tungsten.

21. A contact according to claim 17 further comprising a second refractory layer disposed on a side of said first-mentioned refractory layer opposite said dopant layer, said first refractory layer being of a different material than said second refractory layer.

* * * * *